(12) United States Patent
Song et al.

(10) Patent No.: US 10,404,316 B1
(45) Date of Patent: Sep. 3, 2019

(54) WIDE-BAND WLAN TRANSCEIVER AND METHOD THEREOF

(71) Applicant: Realtek Semiconductor Corp., Hsinchu (TW)

(72) Inventors: Fei Song, San Jose, CA (US); Chia-Liang (Leon) Lin, Fremont, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 16/149,184

(22) Filed: Oct. 2, 2018

(51) Int. Cl.
| | |
|---|---|
| H03L 7/07 | (2006.01) |
| H04B 1/56 | (2006.01) |
| H04B 1/408 | (2015.01) |
| H03L 7/099 | (2006.01) |
| H03L 7/087 | (2006.01) |
| H04L 7/033 | (2006.01) |
| H03L 7/08 | (2006.01) |

(52) U.S. Cl.
CPC ............. *H04B 1/56* (2013.01); *H03L 7/087* (2013.01); *H03L 7/099* (2013.01); *H04B 1/408* (2013.01); *H04L 7/033* (2013.01)

(58) Field of Classification Search
CPC ........... H04B 1/56; H04B 1/408; H03L 7/087; H03L 7/099; H03L 7/07; H03L 7/16; H03L 7/22; H03L 7/23; H03L 7/235; H04L 7/033

USPC ..................................... 455/85; 327/119–121
See application file for complete search history.

(56) References Cited

U.S. PATENT DOCUMENTS

| | | | | |
|---|---|---|---|---|
| 6,049,238 A | * | 4/2000 | Shimizu ................. | H03K 3/027 327/156 |
| 2003/0229815 A1 | * | 12/2003 | Fujiwara ................... | G06F 1/06 713/500 |
| 2012/0313676 A1 | * | 12/2012 | Nguyen .................... | H03L 7/23 327/156 |

* cited by examiner

*Primary Examiner* — Lee Nguyen
(74) *Attorney, Agent, or Firm* — McClure, Qualey, & Rodack, LLP

(57) ABSTRACT

A method includes generating a reference clock using a crystal oscillator; generating a first clock based on the reference clock using a clock multiplier unit, in which a frequency of the first clock is higher than a frequency of the reference clock by a clock multiplier factor; generating a second lock based on the first clock using a frequency multiplying circuit in accordance with a frequency multiplying signal, in which a frequency of the second clock is higher than the frequency of the first clock by a factor that is equal to either five fourths or three halves, depending on whether the frequency multiplying signal is in a first state or in a second state; dividing down the second clock by a factor of two to generate a first LO (local oscillator) signal; dividing down the first LO signal by a factor of two to generate a second LO signal.

12 Claims, 2 Drawing Sheets

WIDE-BAND WLAN TRANSCEIVER AND METHOD THEREOF

BACKGROUND OF THE INVENTION

Field of the Invention

The present invention generally relates to WLAN (wireless local area network) devices, and more particularly to WLAN circuits that support multiple frequencies.

Description of Related Art

A WLAN is a wireless distribution method for two or more devices that use high-frequency radio waves and often include an access to the internet. Most modern WLANs are based on IEEE802.11 standards and operate in both the 2.4 GHz and 5 GHz bands. Discussions are ongoing regarding extending WLAN to cover the 6 GHz band. It is therefore desirable to have a configurable transceiver that can support all three bands: 2.4 GHz, 5 GHz, and 6 GHz.

BRIEF SUMMARY OF THIS INVENTION

In an embodiment, a transceiver comprises: an antenna configured to provide an interface between an antenna signal and ambient space; a diplexer configured to multiplex a first RF (radio frequency) signal and a second RF signal onto the antenna signal; a first frontend circuit configured to either up-convert a first baseband signal into the first RF signal or down-convert the first RF signal into a second baseband signal, in accordance with a transmit enabling signal, based on a first LO (local oscillator) signal; a second frontend circuit configured to either up-convert a third baseband signal into the second RF signal or down-convert the second RF signal into a fourth baseband signal, in accordance with the transmit enabling signal, based on a second LO signal; a transmitter baseband circuit configured to receive a first digital signal and output the first baseband signal and the third baseband signal in accordance with a band select signal; a receiver baseband circuit configured to receive the second baseband signal and the fourth baseband signal and output a second digital signal in accordance with the band select signal; a digital signal processor configured to receive a first data and the second digital signal and output a second data and the first digital signal; and a frequency synthesizer configured to output the first LO signal and the second LO signal in accordance with a clock multiplier factor and a frequency multiplying signal, the frequency synthesizer comprising: a crystal oscillator configured to output a reference clock, a clock multiplier unit configured to receive the reference clock and output a first clock in accordance with the clock multiplier factor, a frequency multiplying circuit configured to receive the first clock and output a second clock in accordance with the frequency multiplying signal, a first divide-by-two circuit configured to receive the second clock and output the first LO signal; and a second divide-by-two circuit configured to receive the first LO signal and output the second LO signal, wherein: a frequency of the first clock is higher than a frequency of the reference clock by the clock multiplier factor, and a ratio between a frequency of the second clock and the frequency of the first clock is either five fourths or three halves, depending on whether the frequency multiplying signal is in a first state or in a second state.

In an embodiment, a method comprises: generating a reference clock using a crystal oscillator; generating a first clock based on the reference clock using a clock multiplier unit, wherein a frequency of the first clock is higher than a frequency of the reference clock by a clock multiplier factor; generating a second lock based on the first clock using a frequency multiplying circuit in accordance with a frequency multiplying signal, wherein a frequency of the second clock is higher than the frequency of the first clock by a factor that is equal to either five fourths or three halves, depending on whether the frequency multiplying signal is in a first state or in a second state; dividing down the second clock by a factor of two to generate a first LO (local oscillator) signal; dividing down the first LO signal by a factor of two to generate a second LO signal; setting the frequency multiplying signal to the first state and using the first LO signal to perform up-conversion and down-conversion for a frequency range approximately from 4.9 GHz to 6 GHz; setting the frequency multiplying signal to the second state and using the first LO signal to perform up-conversion and down-conversion for a frequency range approximately from 6 GHz to 7.2 GHz; and setting the frequency multiplying signal to the first state and using the second LO signal to perform up-conversion and down-conversion for a radio frequency transceiver that covers a frequency range approximately from 2.4 GHz to 2.5 GHz.

DETAILED DESCRIPTION OF THIS INVENTION

The present invention relates to WLAN transceivers. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Persons of ordinary skill in the art understand terms and basic concepts related to communication electronics that are used in this disclosure, such as "antenna," "switch," "multiplexer," "demultiplexer," "power amplifier," "low-noise amplifier," "up-converter," "down-converter," "high-pass filter," "low-pass filter," "diplexer," "radio frequency," "local oscillator," "baseband ," "mixer," "crystal oscillator," "clock multiplier unit," "divide-by-two," "digital signal processor."

Throughout this disclosure, the term "clock" refers to a periodic voltage signal that cyclically toggle back and forth between a first level and a second level.

Figure 1:
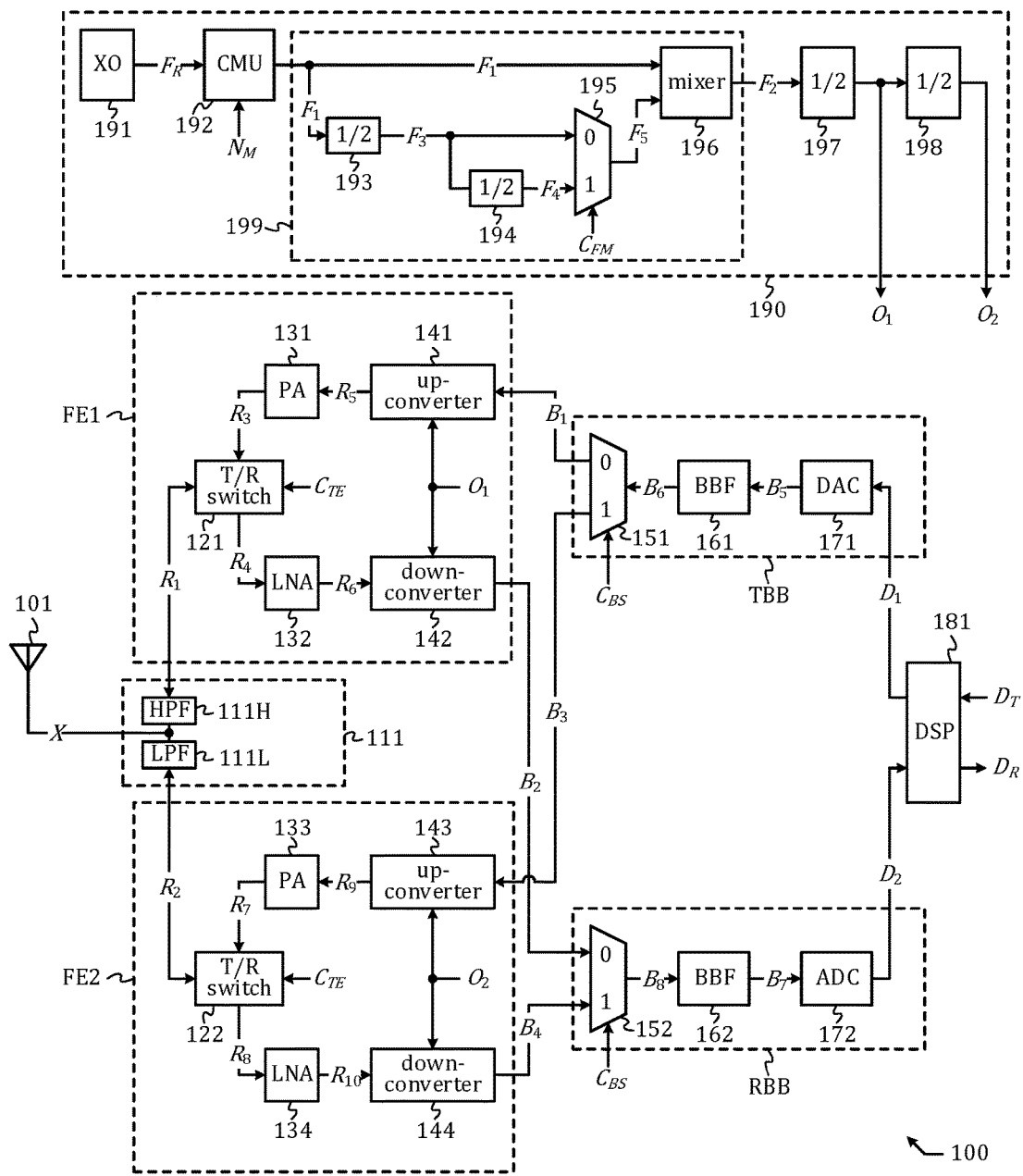
FIG. 1 shows a functional block diagram of a transceiver in accordance with an embodiment of the present invention.

A functional diagram of a transceiver 100 in accordance with an embodiment of the present invention is depicted in FIG. 1. Transceiver 100 comprises: an antenna 101 configured to provide an interface between an antenna signal X and ambient space; a diplexer 111 configured to multiplex a first radio frequency (RF, hereafter) signal $R_1$ and a second RF signal $R_2$ onto the antenna signal X; a first frontend circuit FE1 configured to either up-convert a first baseband signal $B_1$ into the first RF signal $R_1$ or down-convert the first RF signal $R_1$ into a second baseband signal $B_2$, depending on a transmit enabling signal $C_{TE}$, based on a first LO (local oscillator) signal $O_1$; a second frontend circuit FE2 configured to either up-convert a third baseband signal $B_3$ into the second RF signal $R_2$ or down-convert the second RF signal $R_2$ into a fourth baseband signal $B_4$, depending on the transmit enabling signal $C_{TE}$, based on a second LO signal $O_2$; a transmitter baseband circuit TBB configured to receive a first digital signal $D_1$ and output the first baseband signal $B_1$ and the third baseband signal $B_3$ in accordance with a band selection signal $C_{BS}$; a receiver baseband circuit RBB configured to receive the second baseband signal $B_2$ and the fourth baseband signal $B_4$ and output a second digital signal $D_2$ in accordance with the band selection signal $C_{BS}$; a digital signal processor (DSP) configured to receive a first data $D_T$ and the second digital signal $D_2$ and output a second data $D_R$ and the first digital signal $D_1$; and a frequency synthesizer 190 configured to output the first LO signal $O_1$ and the second LO signal $O_2$ in accordance with a clock multiplier factor $N_M$ and a frequency multiplying signal $C_{FM}$.

Transceiver 100 is configured to support 2 G band (approximately covering a frequency range of 2.4 GHz~2.5 GHz), 5 G band (approximately covering a frequency range of 4.9 GHz~5.9 GHz), and 6 G band (approximately covering a frequency range of 5.9 GHz~7.2 GHz) of WLAN. The first frontend circuit FE1 is configured to support signal transmission and reception for the 5 G band and the 6 G band, while the second frontend circuit FE2 is configured to support signal transmission and reception for the 2 G band. The transmitter baseband circuit TBB and the receiver baseband circuit RBB are shared for all the three bands (i.e., 2 G, 5 G, and 6 G). The diplexer 111 comprises a HPF (high pass filter) 111H configured to couple the antenna signal X to the first RF signal $R_1$ and a LPF (low pass filter) 111L configured to couple the antenna signal X to the second RF signal $R_2$. A high-pass corner for HPF 111H is approximately 4.6 GHz, while a low-pass corner for LPF 111L is approximately 2.8 GHz. To a signal in the 5 G band or the 6 G band, HPF 111H is approximately a short circuit while LPF 111L is approximately an open circuit, therefore the antenna 101 is effectively coupled to the first frontend circuit FE1 but decoupled from the second frontend circuit FE2. To a signal in the 2 G band, HPF 111H is approximately an open circuit while LPF 111L is approximately a short circuit, therefore the antenna 101 is effectively coupled to the second frontend circuit FE2 but decoupled from the first frontend circuit FE1.

The first frontend circuit FE1 comprises: a first T/R (transmit/receive) switch 121 configured to multiplex a third RF signal $R_3$ and a fourth RF signal $R_4$ onto the first RF signal $R_1$ in accordance with $C_{TE}$; a first power amplifier (PA) 131 configured to receive a fifth RF signal $R_5$ and output the third RF signal $R_3$; a first upconverter 141 configured to receive first baseband signal $B_1$ and output the fifth RF signal $R_5$ in accordance with the first LO signal $O_1$; a first low-noise amplifier (LNA) 132 configured to receive the fourth RF signal $R_4$ and output a sixth RF signal $R_6$; and a first down-converter 142 configured to receive the sixth RF signal $R_6$ and output the second baseband signal $B_2$ in accordance with the first LO signal $O_1$.

The second frontend circuit FE2 comprises: a second T/R (transmit/receive) switch 122 configured to multiplex a seventh RF signal $R_7$ and an eighth RF signal $R_8$ onto the second RF signal $R_2$ in accordance with $C_{TE}$; a second power amplifier (PA) 133 configured to receive a ninth RF signal $R_9$ and output the seventh RF signal $R_7$; a second upconverter 143 configured to receive third baseband signal $B_3$ and output the ninth RF signal $R_9$ in accordance with the second LO signal $O_2$; a second low-noise amplifier (LNA) 134 configured to receive the eighth RF signal $R_8$ and output a tenth RF signal $R_{10}$; and a second down-converter 144 configured to receive the tenth RF signal $R_{10}$ and output the fourth baseband signal $B_4$ in accordance with the second LO signal $O_2$.

The transmitter baseband circuit TBB comprises: a digital-to-analog converter (DAC) 171 configured to receive the first digital signal $D_1$ and output a fifth baseband signal $B_5$; a first baseband filter (BBF) 161 configured to receive the fifth baseband signal $B_5$ and output a sixth baseband signal $B_6$; and a demultiplexer 151 configured to demultiplex the sixth baseband signal $B_6$ onto either the first baseband signal $B_1$ or the third baseband signal $B_3$ in accordance with $C_{BS}$.

The receiver baseband circuit RBB comprises: an analog-to-digital converter (ADC) 172 configured to receive a seventh baseband signal $B_7$ and output the second digital signal $D_2$; a second baseband filter (BBF) 162 configured to receive an eighth baseband signal $B_8$ and output the seventh baseband signal $B_7$; and a multiplexer 152 configured to multiplex the second baseband signal $B_2$ and the fourth baseband signal $B_4$ onto the eighth baseband signal $B_8$ in accordance with $C_{BS}$.

Transceiver 100 is a TDD (time division duplexing) transceiver that is either in a receiver mode when $C_{TE}$ is 0 or in a transmitter mode when $C_{TE}$ is 1. When $C_{BS}$ is 0, transceiver 100 is supporting the 5 G band and the 6 G band; when $C_{BS}$ is 1, transceiver 100 is supporting the 2 G band. When $C_{TE}$ is 0 and $C_{BS}$ is 0, the antenna signal X is converted into the second digital signal $D_2$ through HPF 111H, T/R switch 121, LNA 132, down-converter 142, multiplexer 152, BBF 162, and ADC 172. When $C_{TE}$ is 0 and $C_{BS}$ is 1, the antenna signal X is converted into the second digital signal $D_2$ through LPF 111L, T/R switch 122, LNA 134, down-converter 144, multiplexer 152, BBF 162, and ADC 172. When $C_{TE}$ is 1 and $C_{BS}$ is 0, the first digital signal $D_1$ is converted into the antenna signal X through DAC 171, BBF 161, demultiplexer 151, up-converter 141, PA 131, T/R switch 121, and HPF 111H. When $C_{TE}$ is 1 and $C_{BS}$ is 1, the first digital signal $D_1$ is converted into the antenna signal X through DAC 171, BBF 161, demultiplexer 151, up-converter 143, PA 133, T/R switch 122, and LPF 111L.

Frontend circuits FE1 and FE2, transmitter baseband circuit TBB, and receiver baseband circuit RBB are well known in the prior art and thus not explained in detail here.

The frequency synthesizer 190 comprises: a crystal oscillator (XO) 191 configured to output a reference clock $F_R$; a clock multiplier unit (CMU) 192 configured to receive the reference clock $F_R$ and output a first clock $F_1$ in accordance with the clock multiplier factor $N_M$; a frequency multiplying circuit 199 configured to receive the first clock $F_1$ and output a second clock $F_2$ in accordance with a frequency multiplying signal $C_{FM}$; a first divide-by-two (1/2) circuit 197 configured to receive the second clock $F_2$ and output the first LO signal $O_1$; and a second divide-by-two circuit 198 configured to receive the first LO signal $O_1$ and output the second LO signal $O_2$, wherein: the frequency multiplying circuit 192 comprises a third divide-by-two circuit 193 configured to receive the first clock $F_1$ and output a third clock $F_3$, a fourth divide-by-two circuit 194 configured to receive the third clock $F_3$ and output a fourth clock $F_4$, a multiplexer 195 configured to output a fifth clock $F_5$ by selecting either the third clock $F_3$ or the fourth clock $F_4$ in accordance with the frequency multiplying signal $C_{FM}$, and a mixer 196 configured to receive the first clock $F_1$ and the fifth clock $F_5$ and output the second clock $F_2$ Let the frequencies of $F_R$, $F_1$, $F_2$, $F_3$, $F_4$, $F_5$, $O_1$, and $O_2$ be $f_R$, $f_1$, $f_2$, $f_3$, $f_4$, $f_5$, $f_{LO1}$, and $f_{LO2}$, respectively. CMU 192 performs a clock multiplying function so that $f_1$ is higher than $f_R$ by the clock multiplying factor $N_M$, i.e.

$$f_1 = N_M f_R \quad (1)$$

The third divide-by-two circuit 193 causes $f_3$ to be half of $f_1$, i.e.

$$f_3 = f_1/2 \quad (2)$$

The fourth divide-by-two circuit 194 causes $f_4$ to be half of $f_3$, i.e.

$$f_4 = f_3/2 \quad (3)$$

The multiplexer 195 causes $f_5$ to be $f_4$ if $C_{FM}=1$, or $f_3$ if $C_{FM}=0$, i.e.

$$f_5 = \begin{cases} f_3 & \text{if } C_{FM} = 0 \\ f_4 & \text{if } C_{FM} = 1 \end{cases} \quad (4)$$

Mixer 196 causes $f_2$ to be a sum of $f_1$ and $f_5$, i.e.

$$f_2 = f_1 + f_5 \quad (5)$$

The first divide-by-two circuit 197 causes $f_{LO1}$ to be half of $f_2$, i.e.

$$f_{LO1} = f_2/2 \quad (6)$$

The second divide-by-two circuit 198 causes $f_{LO2}$ to be half of $f_{LO1}$, i.e.

$$f_{LO2} = f_{LO1}/2 \quad (7)$$

From equations (1), (2), (3), (4), (5), (6), and (7), one can derive the following two equations:

$$f_{Lo1} = \begin{cases} \dfrac{3 N_M f_R}{4} & \text{if } C_{FM} = 0 \\ \dfrac{5 N_M f_R}{8} & \text{if } C_{FM} = 1 \end{cases} \quad (8)$$

$$f_{Lo2} = \begin{cases} \dfrac{3 N_M f_R}{8} & \text{if } C_{FM} = 0 \\ \dfrac{5 N_M f_R}{16} & \text{if } C_{FM} = 1 \end{cases} \quad (9)$$

Crystal oscillators are well known in the prior art and thus not described in detail here. In an embodiment, the CMU 192 is embodied by a phase lock loop, which is well known in the prior art and thus not described in detail here.

By way of example but not limitation: $f_R = 80$ MHz. The first LO signal $O_1$ is used by the first frontend circuit FE1 to perform up-conversion and down-conversion for the 5 G band (approximately 4.9 GHz~5.9 GHz) and 6 G band (approximately 5.9 GHz~7.2 GHz). Therefore, $f_{LO1}$ needs to be tunable and able to cover a frequency range approximately from 4.9 GHz to 7.2 GHz. The values of $N_M$ and $C_{FM}$ are set in accordance with the value of $f_{LO1}$ as shown in the table below:

| $f_{LO1}$ | 4.9 GHz~6 GHz | 6 GHz~7.2 GHz |
|---|---|---|
| $C_{FM}$ | 1 | 0 |
| $N_M$ | 98~120 | 100~120 |
| $f_1$ | 7.84 GHz~9.6 GHz | 8 GHz~9.6 GHz |

Although $f_{LO1}$ covers a range 4.9 GHz~6 GHz that has approximately 38% spread, $f_1$ only needs to cover a range 7.84 GHz~9.6 GHz that has approximately 20% spread. The frequency multiplying circuit 192, therefore, effectively extends a frequency range of the CMU 192.

The second LO signal $O_2$ is used by the second frontend circuit FE2 to perform up-conversion and down-conversion for the 2 G band (approximately 2.4 GHz~2.5 GHz). The values of $N_M$ and $C_3$ are set in accordance with the value of $f_{LO2}$ as shown in the table below:

| $f_{LO2}$ | 2.4 GHz-2.5 Hz |
|---|---|
| $C_{FM}$ | 1 |
| $N_M$ | 96-100 |
| $f_1$ | 7.68 GHz-8 GHz |

To support all the three bands (the 2 G band, the 5 G band, and the 6 G band), $f_1$ needs to cover a range 7.68 GHz~9.6 GHz that has approximately 22% spread.

Note that all the functional blocks in FIG. 1 are all well known in the prior art and can be embodied by any means known in the prior art. Well-known details are not shown or described; for instance, each of the first LO signal $O_1$ and the second LO signal $O_2$ is a four-phase signal that comprises a 0° phase, a 90° phase, a 180° phase, and a 270° phase; each of BBF 161, BBF 162, DAC 171, and ADC 172 comprises two parallel branches including an in-phase branch and a quadrature branch.

Figure 2:
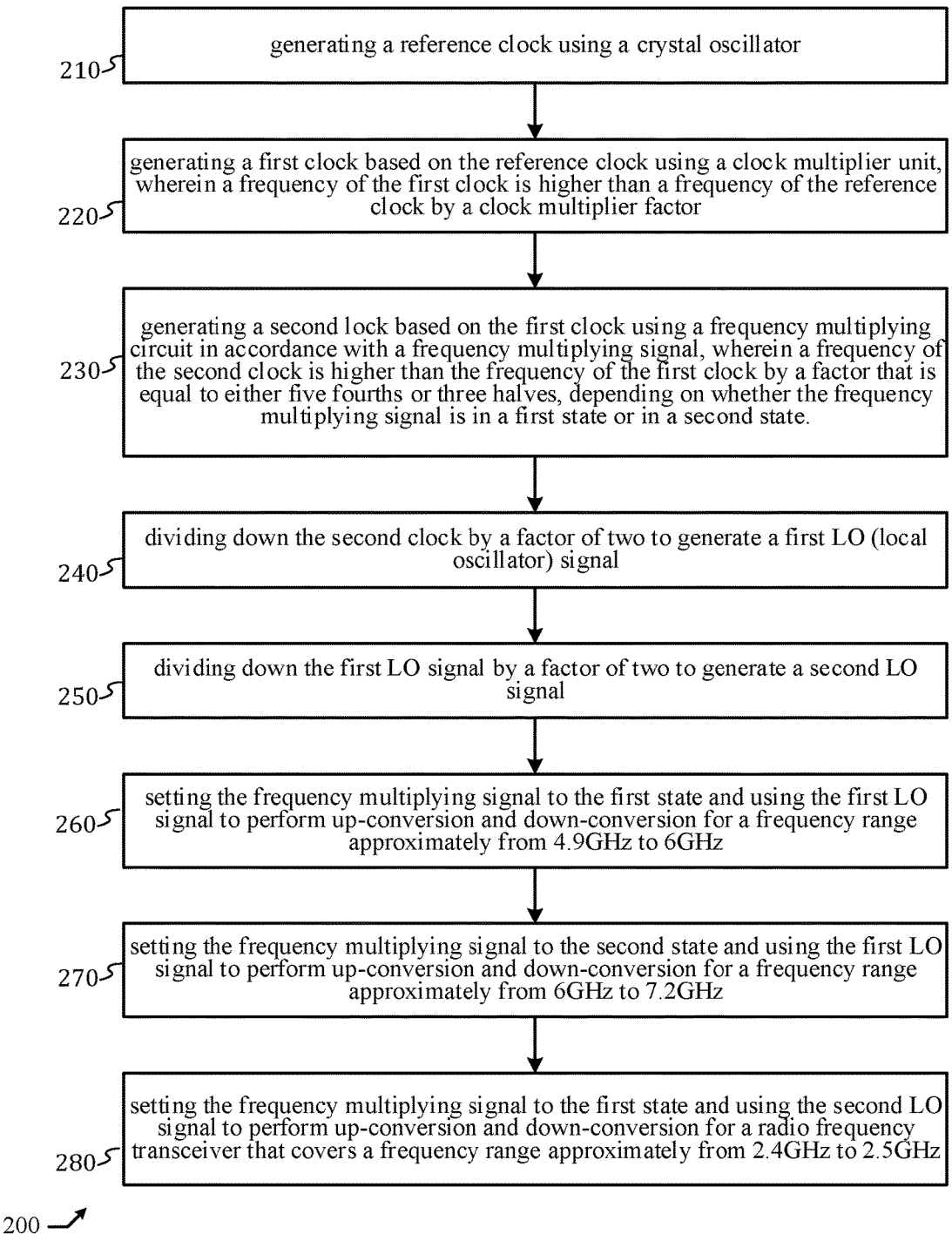
FIG. 2 shows a flow diagram of a method in accordance with an embodiment of the present invention.

As illustrated by a flow diagram 200 shown in FIG. 2, a method in accordance with an embodiment of the present invention comprises: (step 210) generating a reference clock using a crystal oscillator; (step 220) generating a first clock based on the reference clock using a clock multiplier unit, wherein a frequency of the first clock is higher than a frequency of the reference clock by a clock multiplier factor; (step 230) generating a second lock based on the first clock using a frequency multiplying circuit in accordance with a frequency multiplying signal, wherein a frequency of the second clock is higher than the frequency of the first clock by a factor that is equal to either five fourths or three halves, depending on whether the frequency multiplying signal is in a first state or in a second state; (step 240) dividing down the second clock by a factor of two to generate a first LO (local oscillator) signal; (step 250) dividing down the first LO signal by a factor of two to generate a second LO signal; (step 260) setting the frequency multiplying signal to the first state and using the first LO signal to perform up-conversion and down-conversion for a frequency range approximately from 4.9 GHz to 6 GHz; (step 270) setting the frequency multiplying signal to the second state and using the first LO signal to perform up-conversion and down-conversion for a frequency range approximately from 6 GHz to 7.2 GHz; and (step 280) setting the frequency multiplying signal to the first state and using the second LO signal to perform up-conversion and down-conversion for a radio frequency transceiver that covers a frequency range approximately from 2.4 GHz to 2.5 GHz.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transceiver comprising:
   an antenna configured to provide an interface between an antenna signal and ambient space;

a diplexer configured to multiplex a first RF (radio frequency) signal and a second RF signal onto the antenna signal;

a first frontend circuit configured to either up-convert a first baseband signal into the first RF signal or down-convert the first RF signal into a second baseband signal, in accordance with a transmit enabling signal, based on a first LO (local oscillator) signal;

a second frontend circuit configured to either up-convert a third baseband signal into the second RF signal or down-convert the second RF signal into a fourth baseband signal, in accordance with the transmit enabling signal, based on a second LO signal;

a transmitter baseband circuit configured to receive a first digital signal and output the first baseband signal and the third baseband signal in accordance with a band select signal;

a receiver baseband circuit configured to receive the second baseband signal and the fourth baseband signal and output a second digital signal in accordance with the band select signal;

a digital signal processor configured to receive a first data and the second digital signal and output a second data and the first digital signal; and a frequency synthesizer configured to output the first LO signal and the second LO signal in accordance with a clock multiplier factor and a frequency multiplying signal, the frequency synthesizer comprising: a crystal oscillator configured to output a reference clock, a clock multiplier unit configured to receive the reference clock and output a first clock in accordance with the clock multiplier factor, a frequency multiplying circuit configured to receive the first clock and output a second clock in accordance with the frequency multiplying signal, a first divide-by-two circuit configured to receive the second clock and output the first LO signal; and a second divide-by-two circuit configured to receive the first LO signal and output the second LO signal, wherein: a frequency of the first clock is higher than a frequency of the reference clock by the clock multiplier factor , and a ratio between a frequency of the second clock and the frequency of the first clock is either five fourths or three halves, depending on whether the frequency multiplying signal is in a first state or in a second state.

2. The transceiver of claim 1, wherein clock multiplier unit is a phase lock loop.

3. The transceiver of claim 1, wherein the frequency multiplying circuit comprises: a third divide-by-two circuit configured to receive the first clock and output a third clock, a fourth divide-by-two circuit configured to receive the third clock and output a fourth clock, a multiplexer configured to output a fifth clock by selecting either the third clock or the fourth clock in accordance with the frequency multiplying signal, and a mixer configured to receive the first clock and the fifth clock and output the second clock.

4. The transceiver of claim 3, wherein the multiplexer selects the fourth clock when the frequency multiplying signal is in the first state and selects the third clock when the frequency multiplying signal is in the second state.

5. The transceiver of claim 1, wherein the transceiver supports a 5 G band and a 6 G band when the band select signal is in a first state and supports a 2 G band when the band selection signal is in a second state, wherein the 2 G band approximately covers 2.4 GHz~2.5 GHz range, the 5 G band approximately covers 4.9 GHz~5.9 GHz range, and the 6 G band approximately covers 5.9 GHz~7.2 GHz range.

6. The transceiver of claim 5, wherein the frequency multiplying signal is in the second state when transceiver supports approximately 6 GHz~7.2 GHz range of the 6 G band.

7. The transceiver of claim 6, wherein the frequency multiplying signal is in the first state when the transceiver supports the 2 G band, the 5 G band, and approximately 5.9 GHz~6 GHz range of the 6 G band.

8. The transceiver of claim 1, wherein the diplexer comprises a high-pass filter configured to couple the antenna signal to the first RF signal, and a low-pass filter configured to couple the antenna signal to the second RF signal.

9. A method comprising:

generating a reference clock using a crystal oscillator;

generating a first clock based on the reference clock using a clock multiplier unit, wherein a frequency of the first clock is higher than a frequency of the reference clock by a clock multiplier factor;

generating a second clock based on the first clock using a frequency multiplying circuit in accordance with a frequency multiplying signal, wherein a frequency of the second clock is higher than the frequency of the first clock by a factor that is equal to either five fourths or three halves, depending on whether the frequency multiplying signal is in a first state or in a second state;

dividing down the second clock by a factor of two to generate a first LO (local oscillator) signal;

dividing down the first LO signal by a factor of two to generate a second LO signal;

setting the frequency multiplying signal to the first state and using the first LO signal to perform up-conversion and down-conversion for a frequency range approximately from 4.9 GHz to 6 GHz;

setting the frequency multiplying signal to the second state and using the first LO signal to perform up-conversion and down-conversion for a frequency range approximately from 6 GHz to 7.2 GHz; and setting the frequency multiplying signal to the first state and using the second LO signal to perform up-conversion and down-conversion for a radio frequency transceiver that covers a frequency range approximately from 2.4 GHz to 2.5 GHz.

10. The method of claim 9, wherein the clock multiplier unit is a phase lock loop.

11. The method of claim 9, wherein the frequency multiplying circuit comprises: a first divide-by-two circuit configured to receive the first clock and output a third clock, a second divide-by-two circuit configured to receive the third clock and output a fourth clock, a multiplexer configured to output a fifth clock by selecting either the third clock or the fourth clock in accordance with the frequency multiplying signal, and a mixer configured to receive the first clock and the fifth clock and output the second clock.

12. The method of claim 11, wherein the multiplexer selects the fourth clock when the frequency multiplying signal is in the first state and selects the third clock when the frequency multiplying signal is in the second state.

* * * * *